United States Patent
Komada et al.

(10) Patent No.: US 8,211,726 B2
(45) Date of Patent: Jul. 3, 2012

(54) METHOD OF MANUFACTURING NITRIDE SEMICONDUCTOR LIGHT EMITTING DEVICE

(75) Inventors: Satoshi Komada, Mihara (JP); Mayuko Fudeta, Mihara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 647 days.

(21) Appl. No.: 11/707,058

(22) Filed: Feb. 16, 2007

(65) Prior Publication Data

US 2007/0200126 A1    Aug. 30, 2007

(30) Foreign Application Priority Data

Feb. 27, 2006   (JP) ................. 2006-050822

(51) Int. Cl.
*H01L 21/20* (2006.01)

(52) U.S. Cl. ......... 438/47; 438/45; 438/46; 257/E21.09; 257/E21.093; 257/E21.098; 257/E21.11

(58) Field of Classification Search .............. 438/22, 438/45–47; 257/E21.09, 93, 98, 11
See application file for complete search history.

(56) References Cited

U.S. PATENT DOCUMENTS

| | | | |
|---|---|---|---|
| 4,844,719 A | 7/1989 | Toyomoto et al. | |
| 5,990,496 A | 11/1999 | Kunisato et al. | |
| 6,071,351 A | 6/2000 | Venkatasubramanian | |
| 6,084,899 A | 7/2000 | Shakuda | |
| 6,150,677 A | 11/2000 | Tanaka et al. | |
| 6,162,656 A | 12/2000 | Kunisato et al. | |
| 6,258,619 B1 | 7/2001 | Sonobe et al. | |
| 6,337,493 B1 | 1/2002 | Tanizawa et al. | |
| 6,369,506 B1 | 4/2002 | Hata | |
| 6,580,099 B2 | 6/2003 | Nakamura et al. | |
| 7,042,019 B1 | 5/2006 | Wu et al. | |
| 7,095,042 B2 | 8/2006 | Kim et al. | |
| 7,396,697 B2 * | 7/2008 | Hasegawa et al. | 438/40 |
| 2003/0127658 A1 | 7/2003 | Sheu et al. | |

(Continued)

FOREIGN PATENT DOCUMENTS

CN   1540775   10/2004

(Continued)

OTHER PUBLICATIONS

English translation of JP 2001196702.*

(Continued)

*Primary Examiner* — Minchul Yang
(74) *Attorney, Agent, or Firm* — Morrison & Foerster LLP

(57) ABSTRACT

An object is to provide a method of manufacturing a nitride semiconductor light emitting device having high light emission output and allowing decrease in forward voltage (Vf). The invention is directed to a method of manufacturing a nitride semiconductor light emitting device including at least an n-type nitride semiconductor, a p-type nitride semiconductor and an active layer formed between the n-type nitride semiconductor and the p-type nitride semiconductor, wherein the n-type nitride semiconductor includes at least an n-type contact layer and an n-side GaN layer, the n-side GaN layer consists of a single or a plurality of undoped and/or n-type layers, and the method includes the step of forming the n-side GaN layer by organic metal vapor deposition with the growth temperature set within the range of 500 to 1000° C., such that the n-side GaN layer is formed between the n-type contact layer and the active layer.

16 Claims, 3 Drawing Sheets

U.S. PATENT DOCUMENTS

| | | | |
|---|---|---|---|
| 2004/0031978 A1* | 2/2004 | D'Evelyn et al. | 257/233 |
| 2004/0056259 A1* | 3/2004 | Goto et al. | 257/79 |
| 2004/0159848 A1 | 8/2004 | Yamaguchi et al. | |
| 2004/0222499 A1* | 11/2004 | Shibata et al. | 257/613 |
| 2004/0245540 A1* | 12/2004 | Hata et al. | 257/99 |
| 2005/0161688 A1 | 7/2005 | Biwa et al. | |
| 2006/0054917 A1 | 3/2006 | Lee et al. | |
| 2006/0234411 A1 | 10/2006 | Ryu et al. | |
| 2007/0194328 A1 | 8/2007 | Komada | |
| 2007/0202621 A1 | 8/2007 | Komada | |
| 2007/0284588 A1 | 12/2007 | Kinoshita | |
| 2008/0131988 A1 | 6/2008 | Lee et al. | |

FOREIGN PATENT DOCUMENTS

| | | |
|---|---|---|
| JP | 9-232681 | 9/1997 |
| JP | 11-330554 | 11/1999 |
| JP | 2000-244072 | 9/2000 |
| JP | 2001196702 A * | 7/2001 |
| JP | 2002-374002 | 12/2002 |
| JP | 2003-86903 | 3/2003 |
| JP | 2004-047867 | 2/2004 |
| JP | 2005-235960 | 9/2005 |
| JP | 2005-268581 | 9/2005 |

OTHER PUBLICATIONS

English translation of JP 2001196702, Jul. 2001.*

U.S. Office Action mailed on Dec. 23, 2008 directed towards related U.S. Appl. No. 11/706,267; 21 pages.

U.S. Office Action mailed on Dec. 31, 2008 directed towards related U.S. Appl. No. 11/706,266; 7 pages.

Komada, S. et al., U.S. Office Action mailed Apr. 16, 2009, directed to related U.S. Appl. No. 11/706,267; 18 pages.

Komada et al., U.S. Office Action mailed Jun. 18, 2009, directed to related U.S. Appl. No. 11/706,266; (7 pages).

Office Action mailed Sep. 26, 2008 directed to U.S. Appl. No. 11/706,267; 19 pages.

* cited by examiner

METHOD OF MANUFACTURING NITRIDE SEMICONDUCTOR LIGHT EMITTING DEVICE

This nonprovisional application is based on Japanese Patent Application No. 2006-050822 filed with the Japan Patent Office on Feb. 27, 2006, the entire contents of which are hereby incorporated by reference.

BACKGROUND OF THE INVENTION

1. Field of the Invention

The present invention relates to a method of manufacturing a nitride semiconductor light emitting device suitably applicable to light emitting devices such as a light emitting diode (LED) or a laser diode (LD), a light receiving device such as a solar battery or an optical sensor, or to electronic devices such as a transistor or a power device.

2. Description of the Background Art

When an LED is used as an illuminating light source or a backlight for a display, it is necessary that the device has high light emitting efficiency and low forward voltage (hereinafter denoted as Vf). Japanese Patent Laying-Open No. 11-330554 discloses a nitride semiconductor light emitting diode having an active layer between an n-side nitride semiconductor layer and a p-side nitride semiconductor layer, allowing improved light emission output by providing an n-side multi-layered film layer formed of at least three layers including at least one first nitride semiconductor layer of undoped $In_xGa_{1-x}N$ (0<x<1) and at least one second nitride semiconductor layer of undoped $In_yGa_{1-y}N$ (0≦y<1, y<x) on an n-side contact layer, on which the n-electrode of n-side nitride semiconductor layer is formed.

The structure proposed in Japanese Patent Laying-Open No. 11-330554, however, has a tertiary mixed crystal of InGaN grown on the n-side contact layer, which may induce dislocation and defects in the crystal, possibly degrading light emission efficiency of the active layer. In a light emitting device such as an LD that operates with high current density, stacking an InGaN layer having narrower band gap than GaN or AlGaN may be a cause of overflow of introduced carriers. Therefore, there is a need for a technique that attains both high light emission output and low forward voltage (Vf).

SUMMARY OF THE INVENTION

The present invention was made to solve the above-described problem and its object is to provide a method of manufacturing a nitride semiconductor light emitting device having high light emission output while allowing decrease in forward voltage (Vf).

The present invention relates to a method of manufacturing a nitride semiconductor light emitting device including at least an n-type nitride semiconductor, a p-type nitride semiconductor and an active layer formed between the n-type nitride semiconductor and the p-type nitride semiconductor; wherein the n-type nitride semiconductor includes at least an n-type contact layer and an n-side GaN layer; the n-side GaN layer consists of a single or a plurality of undoped and/or n-type layers; and the method includes the step of forming the n-side GaN layer by organic metal vapor deposition with growth temperature set in a range of 500 to 1000° C., such that the n-side GaN layer is formed between the n-type contact layer and the active layer.

In the present invention, preferably, the n-side GaN layer is formed of the n-type layer containing an n-type impurity at a concentration of at least $1 \times 10^{18}/cm^3$.

In the nitride semiconductor light emitting device manufactured through the method of the present invention, preferably, the n-side GaN layer and the active layer are formed to be in contact with each other, and the n-type contact layer contains an n-type impurity at a concentration of at least $1 \times 10^{18}/cm^3$.

In the present invention, preferably, the n-type nitride semiconductor is formed of an undoped or n-type GaN layer.

In the present invention, preferably, growth rate of the n-side GaN layer is at most 2 µm/h.

According to the present invention, an n-side GaN layer is formed at a low temperature between the contact layer and the active layer, whereby a nitride semiconductor light emitting device that has high light emission output and allows decrease in forward voltage (Vf) can be provided.

The nitride semiconductor light emitting device provided by the present invention is suitably applicable to a light emitting device such as a light emitting diode (LED) or a laser diode (LD).

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to the figures. The present invention, however, is not limited to the embodiments. Though an embodiment in which the nitride semiconductor light emitting device of the present invention implemented as an LED will be described in the following, the nitride semiconductor light emitting device in accordance with the present invention is also applicable to a semiconductor laser and the like.

The method of manufacturing the nitride semiconductor light emitting device in accordance with the present invention is a method of manufacturing a nitride semiconductor light emitting device including at least an n-type nitride semiconductor, a p-type nitride semiconductor and an active layer formed between the n-type nitride semiconductor and the p-type nitride semiconductor; wherein the n-type nitride semiconductor includes at least an n-type contact layer and an n-side GaN layer; the n-side GaN layer consists of a single or a plurality of undoped and/or n-type layers. The manufacturing method of the present invention includes the step of forming the n-side GaN layer by organic metal vapor deposition at a growth temperature in the range of 500 to 1000° C., such that the n-side GaN layer is formed between the n-type contact layer and the active layer. In the present invention, as the n-side GaN layer is formed at a low growth temperature of 500 to 100° C., it becomes possible to attain the effect of decreasing Vf, while high light emission output is maintained. Though details as to why the effect of decreasing Vf is attained are not known, a possible reason is that contact resistance at an interface between the n-side GaN layer and the active layer decreases.

Further, in the present invention, as the n-side GaN layer, that is, the GaN layer is formed between the contact layer and the active layer, the problem of lower light emission output caused by crystal defects or dislocation that tend to occur when tertiary mixed crystal such as InGaN is formed, can advantageously be avoided.

Figure 5:
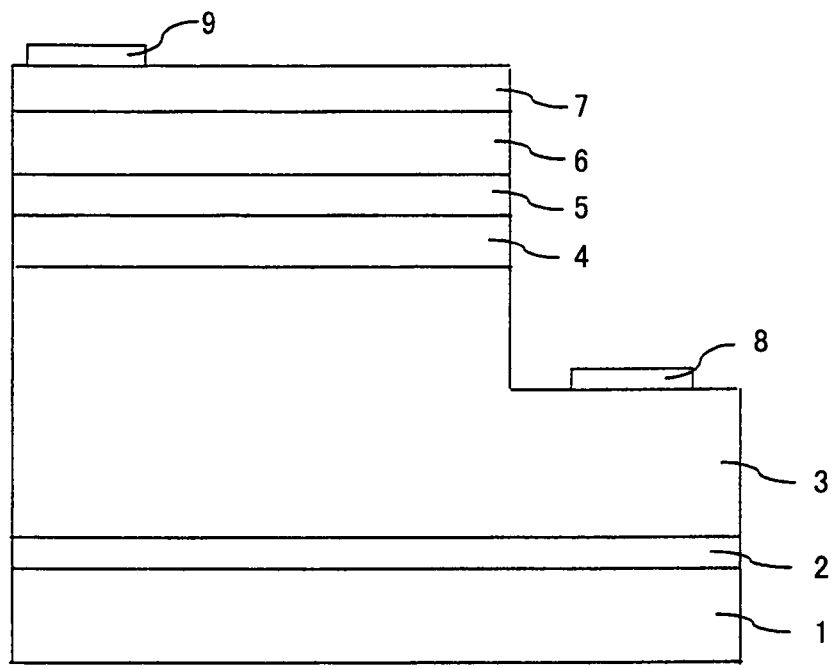
FIG. 5 illustrates a common nitride semiconductor light emitting device.

Referring to FIG. 5, on a substrate 1, a buffer layer 2, an n-type contact layer 3, an active layer 4, a p-type clad layer 5, a p-type contact layer 6, a transparent electrode 7, an n-side pad electrode 8, and a p-side pad electrode 9 are formed. In contrast, referring to FIG. 1, on substrate 1, buffer layer 2, n-type contact layer 3, n-side GaN layer 101, active layer 4, p-type clad layer 5, p-type contact layer 6, transparent electrode 7, n-side pad electrode 8 and p-side pad electrode 9 are formed. In the structure shown in FIG. 1, n-type contact layer 3 and n-side GaN layer 101 form the n-type nitride semiconductor of the present invention, while p-type clad layer 5 and p-type contact layer 6 form the p-type nitride semiconductor of the present invention, and between the n-type nitride semiconductor and the p-type nitride semiconductor, active layer 4 is formed.

In the following, the manufacturing method of the nitride semiconductor light emitting device in accordance with the present invention will be described with reference to the structure shown in FIG. 1 as an example, though the present invention is not limited thereto.

<Substrate 1>

As substrate 1, sapphire (C plane), for example, may be used. In the present invention, preferably, substrate 1 is set in a reaction furnace of an MOCVD apparatus, and growth temperature is increased, for example, to 1050° C. while causing flow of hydrogen, so that substrate 1 is cleaned in advance.

<Buffer Layer 2>

On substrate 1, buffer layer 2 is formed. Specifically, the growth temperature is decreased, for example, to 510° C., and using hydrogen and/or nitrogen as a carrier gas, and ammonia and TMG (trimethyl gallium) as raw material gases, buffer layer 2, for example, of GaN is grown to the thickness of about 200 Å on substrate 1.

<N-type Nitride Semiconductor>

(N-Type Contact Layer 3)

On buffer layer 2, an n-type contact layer 3 is formed. It is preferred that n-type contact layer 3 contains an n-type impurity such as Si at a concentration of at least $1 \times 10^{18}/cm^3$. This further improves the effect of reducing Vf. More preferably, the n-type impurity concentration is at least $5 \times 10^{18}/cm^3$. N-type contact layer 3 is formed, using hydrogen and/or nitrogen as the carrier gas, ammonia and TMG as the raw material gases, and silane as an impurity gas, with the growth temperature set in the range of 1000 to 1100° C., typically at 1050° C., as a GaN doped with Si to the concentration of $5 \times 10^{18}/cm^3$ grown to the thickness of about 0.5 μm.

(N-Side GaN Layer 101)

On n-type contact layer 3, n-side GaN layer 101 is formed. The n-side GaN layer 101 formed in the present invention consists of a single layer or multiple layers of undoped/or n-type layers formed at a growth temperature in the range of 500 to 1000° C. In the present invention, preferably, the n-side GaN layer is formed of an n-type layer having n-type impurity at a concentration of at least $1 \times 10^{18}/cm^3$ and more preferably at least $5 \times 10^{18}/cm^3$, as good effect of decreasing Vf can be attained.

The undoped layer may be formed by using ammonia and TMG as the raw material gases and a nitrogen-containing gas as the carrier gas, respectively. Further, the n-type layer may be formed by using ammonia and TMG as the raw material gases, hydrogen and/or nitrogen as the carrier gas and silane as the impurity gas, as a layer doped with Si to the concentration of at least $1 \times 10^{18}/cm^3$ and typically at $1 \times 10^{19}/cm^3$.

N-side GaN layer 101 may be grown at a growth temperature in the range of 500 to 1000° C., that is, at a temperature lower than the optimal growth temperature of GaN layer, and better effect of decreasing Vf of the present invention can be attained. Though details as to why Vf reduces when the growth temperature is in the range of 500 to 1000° C. are not clear, a possible reason is that contact resistance between the n-side GaN layer and the active layer decreases. More preferably, the growth temperature of n-side GaN layer is set within the range of 750 to 900° C.

It is preferred that the growth rate of n-side GaN layer is at most 2 μm/h, since particularly good Vf decreasing effect can be attained. The growth rate is preferably at most 1 μm/h and more preferably at most 0.5 μm/h.

As the carrier gas for forming the n-side GaN layer, by way of example, hydrogen and/or nitrogen may be used, and it is preferred to use a nitrogen-containing gas as the carrier gas, as particularly good Vf decreasing effect can be attained. The flow ratio of nitrogen in the nitrogen-containing gas is preferably at least 50% by volume, considering the effect of decreasing Vf. The flow ratio of nitrogen is more preferably at least 70% by volume and further preferably at least 80% by volume. Most preferably, the carrier gas consisting of nitrogen only is used.

The n-side GaN layer 101 may be formed as a single layer or multiple layers, and each layer may be an undoped layer or n-type layer. When formed as multiple layers, the n-side GaN layer may be binary mixed crystal having two n-type layers of different dopant concentrations stacked repeatedly in one, two or more periods. Such an arrangement is preferred as n-side GaN layer of superior crystal property is obtained and light emission output is improved. Specifically, an exemplary n-side GaN layer may have a first GaN layer as an n-type layer doped with an n-type impurity and a second GaN layer as an undoped layer or an n-type layer doped with the n-type impurity to a concentration lower than that of the first GaN layer stacked one after another.

Figure 1:
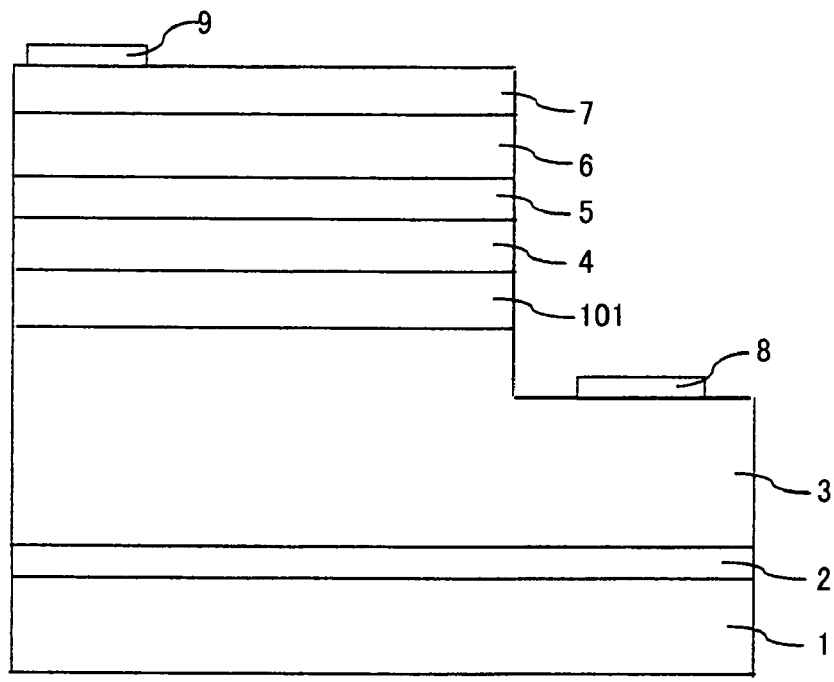
FIG. 1 shows an exemplary structure of the nitride semiconductor light emitting device in accordance with the present invention.
Figure 2:
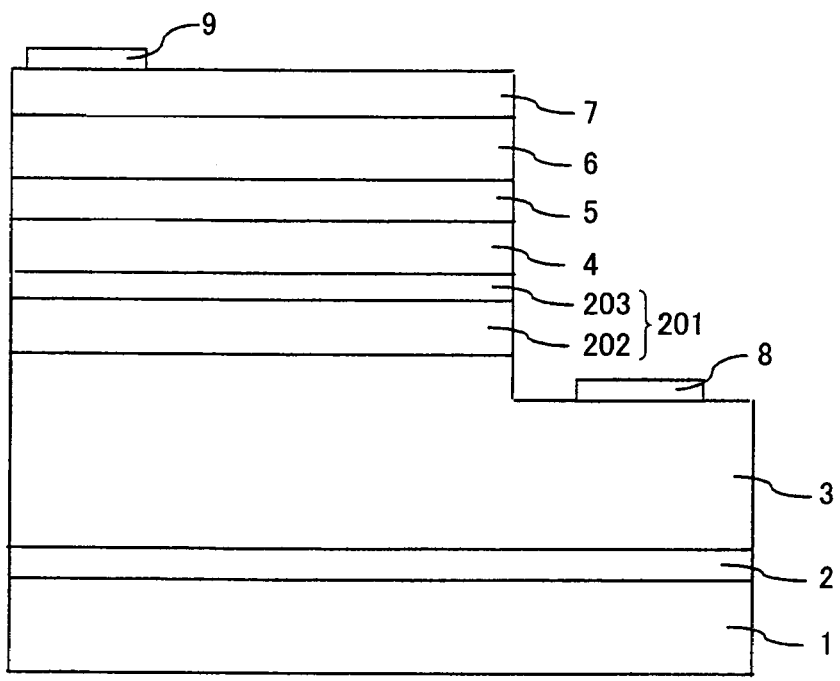
FIGS. 2 to 4 show other exemplary structures of the nitride semiconductor light emitting device in accordance with the present invention.

In the structure shown in FIG. 2, a first GaN layer 202 and a second GaN layer 203 are formed in this order as n-side GaN layer 201 of the present invention. In FIG. 2, the structure except for the n-side GaN layer 201 is the same as that of FIG. 1. The first and second GaN layers 202 and 203 are formed, by way of example, through the following method. Specifically, at a growth temperature of 500 to 1000° C., using hydrogen and/or nitrogen as the carrier gas, ammonia and TMG as the raw material gases, and silane as the impurity gas, the first GaN layer 202 doped with Si to a concentration x of $1 \times 10^{18} < x \leq 1 \times 10^{21}/cm^3$, typically the concentration of $x = 1 \times 10^{19}/cm^3$, is grown to the thickness of about 200 nm, and on the first GaN layer 202, the second GaN layer 203 is grown.

The second GaN layer 203 may be formed as an undoped layer or a layer having n-type impurity concentration lower than that of the first GaN layer 202. When the second GaN layer 203 is formed as an undoped layer, the undoped layer is formed on the first GaN layer 202 to a thickness of about 20 nm, using hydrogen and/or nitrogen as the carrier gas and ammonia and TMG as the raw material gases, at a growth temperature of 500 to 1000° C. When the second GaN layer 203 is formed as an n-type layer having lower impurity concentration than the first GaN layer 202, at a growth temperature of 500 to 1000° C. using hydrogen and/or nitrogen as the carrier gas, ammonia and TMG as the raw material gases and silane as the impurity gas, the n-type layer doped with Si to a concentration x of $1\times10^{17} \leq x \leq 5\times10^{18}/cm^3$, typically the concentration of $x=1\times10^{18}/cm^3$, is formed on the first GaN layer 202 to a thickness of about 20 nm. When the layers are stacked under the conditions described above in the structure shown in FIG. 2, the effect of decreasing Vf similar to that attained by stacking layers under the conditions described above in the structure shown in FIG. 1 can be attained.

When the n-side GaN layer is formed of the first and second GaN layers, the first and second GaN layers 202 and 203 may be stacked in one period as shown in FIG. 2. It is preferred, however, that the first and second GaN layers are stacked alternately and repeatedly for two or more periods, as particularly high effect of improving light emission output can be attained. The repetition period of 5 or more is more preferred. The period of repetition of at most 20 is preferred, as increase in manufacturing cost resulting from complicated process steps for manufacturing the nitride semiconductor light emitting device can be avoided.

When the period of repetition is two or more, it is preferred that the first and second GaN layers each have the thickness of at most 100 nm. In that case, good effect of improving light emission output can be attained. It is more preferred that the first and second GaN layers have the thickness of at most 20 nm. From the viewpoint of attaining good effect of improving light emission output, the thickness of about 20 nm is sufficient to ensure good effect of improving light emission output in accordance with the present invention. In order to sufficiently vary the n-type impurity concentration between the first and second GaN layers, the second GaN layer preferably has the thickness sufficient to prevent the n-type impurity from being diffused from the first GaN layer to the entire second GaN layer, specifically, thickness of at least 2 nm. The first GaN layer preferably has the thickness of at least 1 nm.

When the stacked structure consisting of the first and second GaN layers is repeated twice or more, the order of stacking of the first and second GaN layers is not specifically limited.

<Active Layer 4>

On n-side GaN layer 101, active layer 4 is formed. Specifically, using nitrogen and/or hydrogen as the carrier gas and ammonia, TMG and TMI as raw material gases with the growth temperature lowered, for example, to 650 to 800° and typically at 700° C., $In_{0.25}Ga_{0.75}N$ and GaN having the thickness of about 2.5 nm and about 18 nm, respectively, may be grown alternately for 6 periods, to provide active layer 4 having a multiquantum well structure.

<P-type Nitride Semiconductor>

(P-Type Clad Layer 5)

On active layer 4, p-type clad layer 5 is formed. Specifically, using hydrogen and/or nitrogen as the carrier gas, ammonia, TMA and TMG raw material gases, and CP2Mg (cyclopentadienyl magnesium) as the impurity gas with the growth temperature increased, for example, to 900 to 1000° C. and typically to 950° C., p-type clad layer 5 of $Al_{0.15}Ga_{0.85}N$ doped with Mg to a concentration of, for example, $5\times10^{19}/cm^3$ is grown to the thickness of about 30 nm.

(P-Type Contact Layer 6)

On p-type clad layer 5, p-type contact layer 6 is formed. Specifically, using hydrogen and/or nitrogen as the carrier gas, ammonia and TMG raw material gases, and CP2Mg as the impurity gas with the growth temperature, for example, at 900 to 1000° C. and typically at 950° C., p-type contact layer 6 of GaN doped with Mg to a concentration of, for example, $1\times10^{20}/cm^3$ is grown to the thickness of about 0.1 μm.

<Annealing>

Next, annealing is performed using nitrogen as the carrier gas with the growth temperature lowered, for example, to 700° C. Through the method described above, a wafer having, formed on substrate 1, buffer layer 2, n-type contact layer 3, n-side GaN layer 101, active layer 4, p-type clad layer 5 and p-type contact layer 6, is obtained.

<Electrode Formation>

The wafer obtained by the above-described method is taken out from the reaction furnace, a mask patterned to a prescribed shape is formed on a surface of the uppermost layer, that is, p-type contact layer 6, and etching is done from the side of p-type contact layer 6 by an RIE (Reactive Ion Etching) apparatus, so that the surface of n-type contact layer 3 is exposed. After etching, almost on the entire surface of the uppermost, p-type contact layer 6, transparent electrode 7 containing Pd is formed to the thickness of about 7 nm, and at a prescribed position thereon, p-side pad electrode 9 of Au is formed to the thickness of about 0.5 μm, respectively. On the surface of n-type contact layer 3 exposed by etching, n-side pad electrode 8 containing Ti and Al is formed. In this manner, the LED as the nitride semiconductor light emitting device in accordance with the present invention can be obtained.

Figure 3:
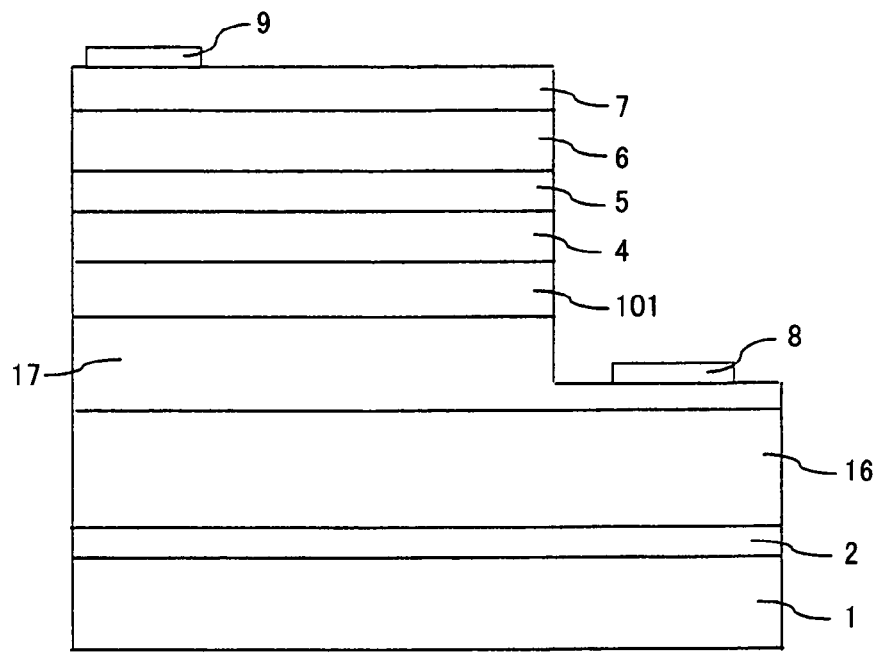

As shown in FIG. 3, in the present invention, underlying n-type GaN layer 16 and n+ contact layer 17 are formed in this order on buffer layer 2. The structure shown in FIG. 3 is the same as the structure shown in FIG. 1 except that n-type contact layer 3 of FIG. 1 is replaced by underlying n-type GaN layer 16 and n+ contact layer 17. Specifically, the nitride semiconductor light emitting device having the structure shown in FIG. 3 can be formed by the method as described above with reference to the structure of FIG. 1 except that the steps of forming the n-type contact layer 3 of FIG. 1 are replaced by the steps of forming n-type underlying GaN layer 16 and n+ contact layer 17 as specified below. Therefore, the method of forming layers other than n-type underlying GaN layer 16 and n+ contact layer 17 will not be repeated here. In the following, the method of forming n-type underlying GaN layer 16 and n+ contact layer 17 will be described.

(Underlying n-Type GaN Layer 16)

Underlying n-type GaN layer 16 shown in FIG. 3 is formed at a growth temperature of 1000 to 1100° C., typically at 1050° C., using hydrogen and/or nitrogen as the carrier gas, ammonia and TMG as the raw material gases and silane as the impurity gas, as a layer having the thickness of about 5 μm doped with Si to a concentration of $1\times10^{18}/cm^3$.

(N+ Contact Layer 17)

On underlying n-type GaN layer 16 formed as described above, n+ contact layer 17 is formed at a growth temperature of 1000 to 1100° C., typically at 1050° C., using hydrogen and/or nitrogen as the carrier gas, ammonia and TMG as the raw material gases and silane as the impurity gas, as a GaN layer having the thickness of about 1 μm doped with Si to a concentration of $1\times10^{19}/cm^3$. On n+ contact layer 17, n-side GaN layer 101 of the present invention is formed.

<N-Type Nitride Semiconductor Layer>

In the present invention, between the n-side GaN layer and the n-type contact layer, or between the n-side GaN layer and the active layer, an n-type nitride semiconductor layer for improving the effect of carrier confinement may be provided. A possible n-type nitride semiconductor layer is, for example, an AlGaN layer. Preferable composition of the AlGaN layer is $Al_{0.01}Ga_{0.99}N$ to $Al_{0.30}Ga_{0.70}N$, and the effect of carrier confinement is particularly good with such a composition.

When the AlGaN layer is formed between the n-side GaN layer and the n-type contact layer, the AlGaN layer may be formed, at a growth temperature of 1000 to 1100° C., typically at 1050° C., using hydrogen and/or nitrogen as the carrier gas, ammonia, TMA and TMG as the raw material gases and silane as the impurity gas, as an $Al_{0.15}Ga_{0.85}N$ layer having the thickness of about 30 nm, doped with Si as the n-type impurity to a concentration of $1\times10^{18}/cm^3$.

Alternatively, when the AlGaN layer is formed between the n-side GaN layer and the active layer, the AlGaN layer may be formed, at a growth temperature of 500 to 1000° C., typically at 750° C., using nitrogen as the carrier gas and the same raw material gases as above, as an $Al_{0.15}Ga_{0.85}N$ layer having the thickness of about 30 nm, doped with Si as the n-type impurity to a concentration of $1\times10^{18}/cm^3$.

The present invention is also advantageous in that, since the n-side GaN layer, that is, a GaN layer is formed between the contact layer and the active layer, the problem of lower light emission output caused by crystal defects or dislocation, which tend to occur when a tertiary mixed crystal such as InGaN layer is formed, can be avoided. In the nitride semiconductor light emitting device obtained in accordance with the present invention, it is also preferred that the layer forming the n-type nitride semiconductor is formed only of an undoped or n-type GaN layer. In that case, the n-type nitride semiconductor does not include any layer of InGaN or the like, and hence it has good crystal property. Therefore, better light emission output can be attained and better effect of decreasing Vf can also be attained.

In the present invention, it is preferred that the n-side GaN layer and the active layer are formed in contact with each other and that the n-type contact layer contains n-type impurity at a concentration of at least $1\times10^{18}/cm^3$, since better effect of decreasing Vf can be attained. Here, it is further preferred that the n-type contact layer contains the n-type impurity at a concentration of at least $1\times10^{18}/cm^3$ and that the n-side GaN layer includes at least a layer that contains the n-type impurity at a concentration of at least $1\times10^{18}/cm^3$.

In the following, an exemplary structure of the nitride semiconductor light emitting device in accordance with the present invention in which a conductive substrate is used as the supporting substrate will be described with reference to FIG. 4. In the structure shown in FIG. 4, on a conductive substrate 22, a first ohmic electrode 23, a first metal layer 24 for adhesion, a second metal layer 21 for adhesion, a protective layer 20, a reflective layer 19, a second ohmic electrode 18, p-type contact layer 6, p-type clad layer 5, active layer 4, n-side GaN layer 101, an underlying n-type GaN layer 28, an n+ contact layer 27, a transparent conductor electrode 25 and a bonding pad electrode 26 are formed in this order. The p-type contact layer 6 and p-type clad layer 5 form the p-type nitride semiconductor of the present invention, and n-side GaN layer 101, underlying n-type GaN layer 28 and n+ contact layer 27 form the n-type nitride semiconductor of the present invention.

Figure 4:
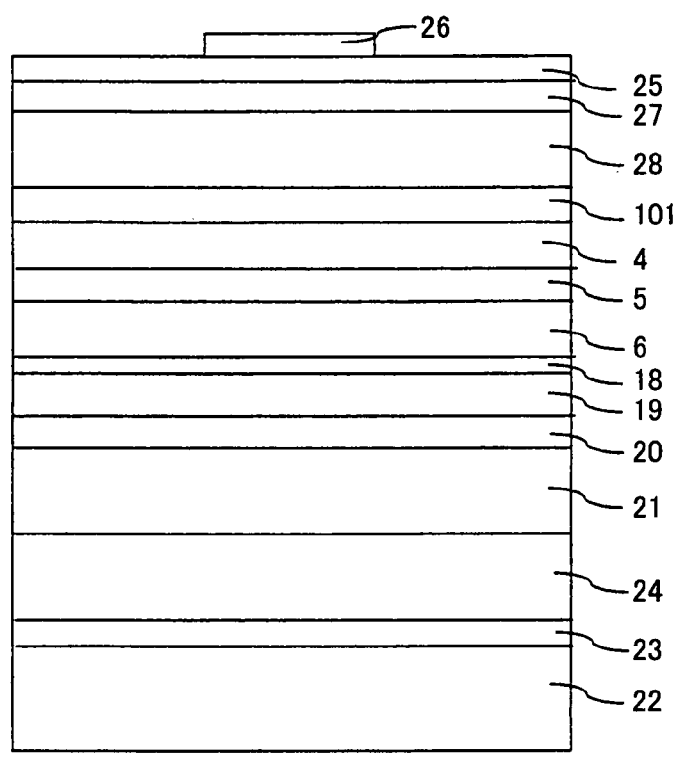

A method of forming the nitride semiconductor light emitting device having such a structure as shown in FIG. 4 will be described in the following. The steps except for the steps of forming the n-type nitride semiconductor and the electrodes are the same as the method described with reference to FIGS. 1 to 3 above, and therefore, description thereof will not be repeated. In the following, the method of forming the n-type nitride semiconductor and the electrodes will be described.

<N-Type Nitride Semiconductor>

(N+ Contact Layer 27)

On a sapphire substrate (not shown) having a buffer layer formed on a surface thereof, n+ contact layer 27 of GaN doped with Si to a concentration of $1\times10^{19}/cm^3$ is grown to the thickness of about 0.1 μm, using hydrogen and/or nitrogen as the carrier gas, ammonia and TMG as the raw material gases and silane as the impurity gas, with the growth temperature set within a range of 1000 to 1100° C., typically at 1050° C.

(Underlying n-Type GaN Layer 28)

Next, using hydrogen and/or nitrogen as the carrier gas, ammonia and TMG as the raw material gases and silane as the impurity gas, with the growth temperature set within a range of 1000 to 1100° C., typically at 1050° C., a GaN layer doped with Si to a concentration of $1\times10^{18}/cm^3$ is grown to the thickness of about 6 μm, as underlying n-type GaN layer 28.

FIG. 4 shows an example in which underlying n-type GaN layer 28 is formed between n+ contact layer 27 and n-side GaN layer 101. Provision of the underlying n-type GaN layer 28 is advantageous in that crystal property is improved, though n-type GaN layer 101 may be grown directly on n+ contact layer 27.

(N-Side GaN Layer 101)

Next, using hydrogen and/or nitrogen as the carrier gas, ammonia and TMG as the raw material gases and silane as the impurity gas, with the growth temperature set within the range of 500 to 1000° C., an undoped GaN layer having the thickness of 20 nm as the second GaN layer and a GaN layer doped with Si to a concentration of $1\times10^{19}/cm^3$ having the thickness of 20 nm as the first GaN layer are formed, and by growing the stacked structure consisting of the second and first GaN layers by 5 periods, the n-side GaN layer 101 is formed.

Thereafter, on n-side GaN layer 1101, active layer 4, p-type clad layer 5 and p-type contact layer 6 are grown. In the method described above, when a nitrogen-containing gas is used as the carrier gas, the effect of decreasing Vf can satisfactorily be attained.

<Electrode Formation>

The wafer obtained by forming the buffer layer, n+ contact layer 27, underlying n-type GaN layer 28, n-side GaN layer 101, active layer 4, p-type clad layer 5 and p-type contact layer 6 on the substrate through the above-described method is annealed, and on p-type contact layer 6, second ohmic electrode layer 18, reflective layer 19, protective layer 20 and the second metal layer 21 for adhesion are formed by EB evaporation (Electron Beam evaporation) method. Here, a Pd layer having the thickness of 3 nm, for example, may be formed as the second ohmic electrode 18, an Ag layer having the thickness of 150 nm, for example, may be formed as reflective layer 19, an Mo layer having the thickness of 50 nm, for example, may be formed as protective layer 20, and an Au layer having the thickness of 3 μm, for example, may be formed as the second metal layer 21 for adhesion.

Then, on a conductive substrate 22 as a supporting substrate prepared separately, the first ohmic electrode 23 and the first metal layer 24 for adhesion are formed in this order by EB evaporation. Here, by way of example, an Si substrate having the thickness of 120 μm may be formed as conductive substrate 22, a Ti/Al combination layer having Ti of 15 nm in thickness and Al of 150 nm in thickness formed in this order may be formed as the first ohmic electrode 23, and an Au/AuSn combination layer having Au of 100 nm in thickness and AuSn of 3 μm in thickness formed in this order may be formed as the first metal layer 24 for adhesion.

Next, the second metal layer 21 for adhesion is formed to join the second metal layer 21 for adhesion and the first metal layer 24 for adhesion. As the second metal layer 21 for adhesion, by way of example, an Au layer having the thickness of 100 nm may be formed. Typically, the Au layer of the Au/AuSn combination layer forming the first metal layer 24 for adhesion is positioned opposite to the Au layer forming the second metal layer 21 for adhesion, and by eutectic bonding, the first metal layer 24 for adhesion and the second metal layer 21 for adhesion are joined. The bonding temperature is set, for example, in the range of 250 to 350° C.

Next, the sapphire substrate and the buffer layer (not shown) are removed. Specifically, by laser irradiation using YAG (yttrium aluminum garnet)—THG (third harmonic generation) laser having the wavelength of 355 nm and directed from the side of sapphire substrate with its rear surface mirror-finished, an interface portion between the buffer layer (not shown) formed on the sapphire substrate and n-type contact layer 15 is thermally decomposed, so that the sapphire substrate and the buffer layer are removed.

On n+ contact layer 27 exposed by the method described above, an ITO (Indium Tin Oxide) layer is formed as transparent conductor electrode 25. Typically, an Sn-doped $In_2O_3$ layer is formed as transparent conductor electrode 25 almost entirely on the surface of n+ contact layer 27, and at a central portion of transparent conductor electrode 25, an n-type bonding pad electrode is formed as bonding pad electrode 26. As bonding pad electrode 26, an Au/Ti combination layer, for example, may be formed.

EXAMPLES

In the following, the present invention will be described in grater detail with reference to specific examples, though the present invention is not limited thereto.

Example 1

In the present example, a nitride semiconductor light emitting device having the structure shown in FIG. 1 was formed.

(Buffer Layer 2)

First, a substrate 1 of sapphire (C plane) was set in a reaction furnace of an MOCVD apparatus, and hydrogen was caused to flow while the growth temperature was increased to 1050° C., so that the substrate was cleaned. Next, the growth temperature was decreased to 510° C., and using hydrogen as the carrier gas and ammonia and TMG (trimethyl gallium) as the raw material gases, a buffer layer 2 of GaN was grown to the thickness of about 200 Å, on substrate 1.

(N-Type Contact Layer 3)

Then, the growth temperature was increased to 1050° C., and using hydrogen as the carrier gas, ammonia and TMG as the raw material gases and silane as the impurity gas, n-type contact layer 3 of GaN doped with Si to a concentration of $1\times10^{18}/cm^3$ was grown to the thickness of 6 µm.

(N-Side GaN Layer 101)

After the growth of n-type contact layer 3, at the growth temperature of 750° C., and using hydrogen as the carrier gas and ammonia and TMG as the raw material gases, an undoped layer is formed as n-side GaN layer 101 was grown to the thickness of 200 nm, with the molar concentration of the raw material gases adjusted to attain growth rate of 0.1 µm/h.

(Active Layer 4)

Then, using nitrogen as the carrier gas and ammonia, TMG and TMI as raw material gases with the growth temperature lowered to 700° C., $In_{0.25}Ga_{0.75}N$ and GaN having the thickness of 2.5 nm and 18 nm, respectively, were grown alternately for 6 periods, to form active layer 4 having the multi-quantum well structure.

(P-Type Clad Layer 5)

Then, using hydrogen as the carrier gas, ammonia, TMA and TMG raw material gases, and CP2Mg (cyclopentadienyl magnesium) as the impurity gas with the growth temperature increased to 950° C., p-type clad layer 5 of $Al_{0.15}Ga_{0.85}N$ doped with Mg to a concentration of $5\times10^{19}/cm^3$ was grown to the thickness of about 30 nm.

(P-Type Contact Layer 6)

Next, using hydrogen as the carrier gas, ammonia and TMG as raw material gases, and CP2Mg as the impurity gas with the growth temperature kept at 950° C., p-type contact layer 6 of GaN doped with Mg to a concentration of $1\times10^{20}/cm^3$ was grown to the thickness of about 0.1 µm.

Through the method described above, a wafer having, formed on substrate 1, buffer layer 2, n-type contact layer 3, n-side GaN layer 101, active layer 4, p-type clad layer 5 and p-type contact layer 6 in this order, was obtained.

(Annealing)

Next, the wafer obtained as above was annealed, using nitrogen as the carrier gas with the growth temperature lowered to 700° C.

(Electrode Formation)

The annealed wafer was taken out from the reaction furnace, a mask patterned to a prescribed shape was formed on a surface of the uppermost layer, that is, p-type contact layer 6, and etching was done from the side of p-type contact layer 6 by an RIE (Reactive Ion Etching) apparatus, so that the surface of n-type contact layer 3 was exposed. After etching, almost on the entire surface of the uppermost, p-type contact layer 6, transparent electrode 7 containing Pd was formed to the thickness of 7 nm, and at a prescribed position thereon, p-side pad electrode 9 of Au was formed to the thickness of 0.5 µm. On the surface of n-type contact layer 3 exposed by etching, n-side pad electrode 8 containing Ti and Al was formed. In this manner, the LED as the nitride semiconductor light emitting device in accordance with the present invention was obtained.

The resulting LED exhibited emission wavelength of 460 nm, emission output of 4.0 mW and forward voltage Vf of 4.4V, when operated with forward current of 20 mA.

Comparative Example 1

In the present comparative example, a nitride semiconductor light emitting device having the structure shown in FIG. 5 was formed. Specifically, an LED as the nitride semiconductor light emitting device was formed through the same method as Example 1 except that n-side GaN layer 101 was not formed between n-type contact layer 3 and active layer 4.

The resulting LED exhibited emission wavelength of 460 nm, emission output of 4.0 mW and forward voltage Vf of 4.7V, when operated with forward current of 20 mA.

From the results of Example 1 and Comparative Example 1, it can be seen that Vf is smaller in Example 1 than in Comparative Example 1, and hence, the effect of decreasing Vf of the present invention was attained.

Example 2

In the present example, a nitride semiconductor light emitting device having the structure shown in FIG. 1 was formed. Specifically, an LED as the nitride semiconductor light emitting device of the present invention was formed through the same method as Example 1 except that nitrogen was used as the carrier gas for forming n-side GaN layer 101 of FIG. 1.

The resulting LED exhibited emission wavelength of 460 nm, emission output of 4.0 mW and forward voltage Vf of 4.0V, when operated with forward current of 20 mA, and the effect of decreasing Vf better than Example 1 could be attained.

Example 3

In the present example, a nitride semiconductor light emitting device having the structure shown in FIG. 1 was formed. Specifically, an LED as the nitride semiconductor light emitting device of the present invention was formed through the same method as Example 1 except that n-side GaN layer 101 of FIG. 1 was formed through the following method.

(N-Side GaN Layer 101)

After the growth of n-type contact layer 3, the growth temperature was lowered to 750° C., and using nitrogen as the carrier gas, ammonia and TMG as the raw material gases and silane as the impurity gas, an n-type layer doped with Si to a concentration of $1\times10^{19}/cm^3$ as n-side GaN layer 101 was grown to the thickness of 200 nm, with the molar concentration of the raw material gases adjusted to attain growth rate of 0.1 μm/h.

The resulting LED exhibited emission wavelength of 460 nm, emission output of 4.0 mW and forward voltage Vf of 3.5V, when operated with forward current of 20 mA, and the effect of decreasing Vf even better than Examples 1 and 2 could be attained.

Example 4

In the present example, a nitride semiconductor light emitting device having the structure shown in FIG. 2 was formed. Specifically, an LED as the nitride semiconductor light emitting device of the present invention was formed through the same method as Example 1 except that n-side GaN layer 201 consisting of first and second GaN layers 202 and 203 shown in FIG. 2 was formed through the following method, in place of n-side GaN layer 101 of FIG. 1.

(N-Side GaN Layer 201)

At a growth temperature of 750° C., using nitrogen as the carrier gas, ammonia and TMG as the raw material gases, and silane as the impurity gas, the first GaN layer 202 as an n-type layer doped with Si to a concentration of $1\times10^{19}/cm^3$ was grown to the thickness of about 200 nm, with the molar concentration of the raw material gases adjusted to attain growth rate of 0.1 μm/h.

Next, at a growth temperature of 750° C., using nitrogen as the carrier gas and ammonia and TMG as the raw material gases, the second GaN layer 203 as an undoped layer was grown to the thickness of 20 nm, with the molar concentration of the raw material gases adjusted to attain growth rate of 0.1 μm/h.

The resulting LED exhibited emission wavelength of 460 nm, emission output of 4.0 mW and forward voltage Vf of 3.5V, when operated with forward current of 20 mA, and the good effect of decreasing Vf comparable to that of Example 3 could be attained.

Example 5

In the present example, a nitride semiconductor light emitting device having the structure shown in FIG. 1 was formed. Specifically, an LED as the nitride semiconductor light emitting device of the present invention was formed through the same method as Example 1 except that a GaN layer having the stacked structure consisting of the first and second GaN layers repeated 9 times was formed as n-side GaN layer 101.

(N-Side GaN Layer 101)

At a growth temperature of 750° C., using nitrogen as the carrier gas, ammonia and TMG as the raw material gases, and silane as the impurity gas, the first GaN layer as an n-type layer doped with Si to a concentration of $1\times10^{19}/cm^3$ was grown to the thickness of 4 nm with the molar concentration of the raw material gases adjusted to attain growth rate of 0.1 μm/h, on the first GaN layer, the second GaN layer as an undoped layer was grown to the thickness of 20 nm under the same conditions as those for the first GaN layer except that the impurity gas was not used, and the first and second GaN layers were stacked alternately for 9 periods.

The resulting LED exhibited emission wavelength of 460 nm, emission output of 5.0 mW and forward voltage Vf of 3.5V, when operated with forward current of 20 mA, and the good effect of decreasing Vf comparable to that of Example 3 could be attained and the light emission output was improved from Example 3 and Comparative Example

Example 6

In the present example, a nitride semiconductor light emitting device having the structure shown in FIG. 3 was formed. Specifically, an LED as the nitride semiconductor light emitting device of the present invention was formed through the same method as Example 5 except that an underlying n-type GaN layer 16 and an n+ contact layer 17 grown by the following method were formed in place of n-type contact layer 3.

(Underlying n-Type GaN Layer 16)

After the growth of buffer layer 2, the growth temperature was increased to 1050° C., and using hydrogen as the carrier gas, ammonia and TMG as the raw material gases and silane as the impurity gas, underlying n-type GaN layer 16 doped with Si to a concentration of $1\times10^{18}/cm^3$ was grown to the thickness of about 5 μm.

(N+ Contact Layer 17)

Next, at the growth temperature of 1050° C., using hydrogen as the carrier gas, ammonia and TMG as the raw material gases and silane as the impurity gas, n+ contact layer 17 of GaN doped with Si to a concentration of $1\times10^{19}/cm^3$ was grown to the thickness of about 1 μm.

The resulting LED exhibited emission wavelength of 460 nm, emission output of 5:0 mW and forward voltage Vf of 3.3V, when operated with forward current of 20 mA, and the effect of decreasing Vf better than that of Example 5 could be attained.

Example 7

In the present example, a nitride semiconductor light emitting device having the structure shown in FIG. 4 was formed. The method used was the same as that of Example 1 except for the steps of forming the n-type nitride semiconductor and the electrodes, and therefore, description thereof will not be repeated. In the following, the method of forming the n-type nitride semiconductor and the electrodes of the present example will be described.

(N+ Contact Layer 27)

On a sapphire substrate (not shown) having a buffer layer formed on a surface thereof, n+ contact layer 27 of GaN doped with Si to a concentration of $1\times10^{19}/cm^3$ was grown to the thickness of 0.1 μm, using hydrogen as the carrier gas, ammonia and TMG as the raw material gases and silane as the impurity gas, with the growth temperature set at 1050° C.

(Underlying n-Type GaN Layer 28)

Next, using hydrogen as the carrier gas, ammonia and TMG as the raw material gases and silane as the impurity gas, with the growth temperature set at 1050° C., underlying n-type GaN layer 28 of GaN doped with Si to a concentration of $1\times10^{18}/cm^3$ was grown to the thickness of 6 μm.

(N-Side GaN Layer 101)

After the growth of underlying n-type GaN layer 28, the growth temperature was lowered to 750° C., and using nitrogen as the carrier gas, ammonia and TMG as the raw material gases, and silane as the impurity gas, with the molar concentration of the raw material gases adjusted to attain growth rate of 0.1 μm/h, an undoped GaN layer as the second GaN layer having the thickness of 20 nm and a GaN layer as an n-type layer doped with Si to a concentration of $1 \times 10^{19}/cm^3$ and having the thickness of 4 nm as the first GaN layer were grown in this order alternately for 9 periods, as the n-side GaN layer 101. Then, active layer 4, p-type clad layer 5 and p-type contact layer 6 were grown by the same method as Example 1.

(Electrode Formation)

The wafer obtained by forming the buffer layer 2, n+ contact layer 27, underlying n-type GaN layer 28, n-side GaN layer 101, active layer 4, p-type clad layer 5 and p-type contact layer 6 on substrate 1 through the above-described method was annealed in the similar manner as in Example 1.

After annealing, on p-type contact layer 6, second ohmic electrode layer 18, reflective layer 19, protective layer 20 and the second metal layer 21 for adhesion were formed successively by EB evaporation (Electron Beam evaporation) method. Here, a Pd layer having the thickness of 3 nm was formed as the second ohmic electrode 18, an Ag layer having the thickness of 150 nm was formed as reflective layer 19, an Mo layer having the thickness of 50 nm was formed as protective layer 20, and an Au layer having the thickness of 3 μm was formed as the second metal layer 21 for adhesion.

Then, on a conductive substrate 22 as a supporting substrate prepared separately, the first ohmic electrode 23 and the first metal layer 24 for adhesion were formed in this order by EB evaporation. Here, by way of example, an Si substrate having the thickness of 120 μm was formed as conductive substrate 22, a Ti/Al combination layer having Ti of 15 nm in thickness and Al of 150 nm in thickness formed in this order was formed as the first ohmic electrode 23, and an Au/AuSn combination layer having Au of 100 nm in thickness and AuSn of 3 μm in thickness formed in this order was formed as the first metal layer 24 for adhesion.

Next, the second metal layer 21 for adhesion was joined with the first metal layer 24 for adhesion. Specifically, the Au layer of the Au/AuSn combination layer forming the first metal layer 24 for adhesion was positioned opposite to the Au layer forming the second metal layer 21 for adhesion, and by eutectic bonding, the layers were joined. The bonding temperature was set to 290° C. Next, the sapphire substrate and the buffer layer were removed. Specifically, by laser irradiation using YAG (yttrium aluminum garnet)—THG (third harmonic generation) laser (wavelength: 355 nm) directed from the side of sapphire substrate with its rear surface mirror-finished, an interface portion between the buffer layer formed on the sapphire substrate and n+ contact layer 7 was thermally decomposed, for removal.

On n+ contact layer 27 exposed by the removal of the substrate and the buffer layer, an Sn-doped $In_2O_3$ layer was formed as transparent conductor electrode 25 almost entirely on the surface, and at a central portion of transparent conductor electrode 25, an n-type bonding pad electrode of an Au/Ti combination layer was formed as bonding pad electrode 26. Through the above-described method, the LED as the nitride semiconductor light emitting device of the present invention was formed.

The resulting LED exhibited emission wavelength of 460 nm, emission output of 10 mW and forward voltage Vf of 3.3V, when operated with forward current of 20 mA, and Vf was decreased than in Comparative Example 2, which will be described below, and the light emission output was improved. It can be understood that not only the effect of decreasing Vf but also the effect of improving light emission output of the present invention could be attained.

Comparative Example 2

Figure 6:
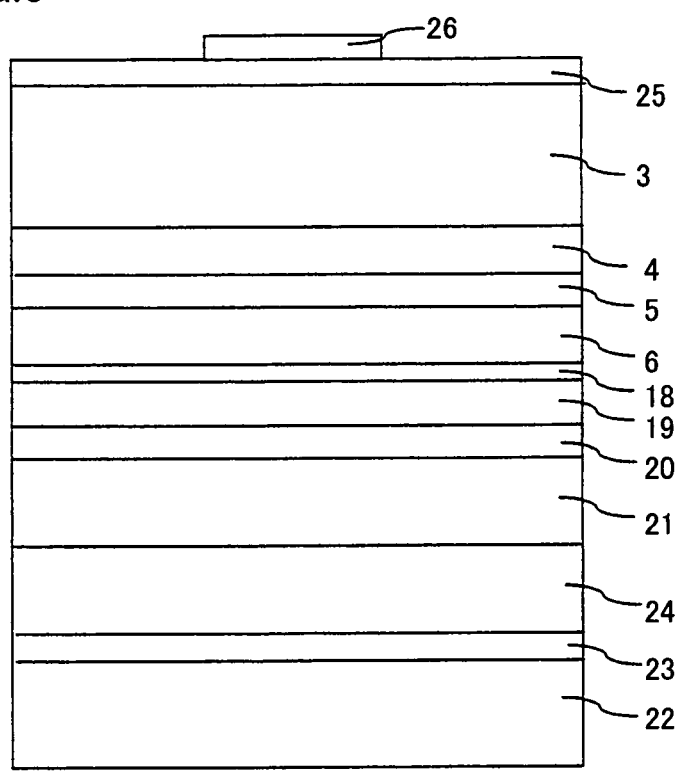
FIG. 6 shows a structure of a nitride semiconductor light emitting device formed as Comparative Example 2.

In the present comparative example, a nitride semiconductor light emitting device having the structure shown in FIG. 6 was formed. Specifically, an LED as the nitride semiconductor light emitting device was formed through the same method as Example 7 except that an n-type contact layer 3 was formed in place of n+ contact layer 27, underlying n-type GaN layer 28 and n-side GaN layer 101.

The resulting LED exhibited emission wavelength of 460 nm, emission output of 8.0 mW and forward voltage Vf of 4.5V, when operated with forward current of 20 mA. Specifically, Vf was higher and the light emission output was lower than those in Example 7.

Example 8

In the present example, a nitride semiconductor light emitting device having the structure shown in FIG. 1 was formed. Specifically, an LED as the nitride semiconductor light emitting device of the present invention was formed through the same method as Example 1 except that the growth temperature of n-side GaN layer 101 was set to 1000° C.

The resulting LED exhibited emission wavelength of 460 nm, emission output of 4.0 mW and forward voltage Vf of 4.5V, when operated with forward current of 20 mA. Though Vf was slightly higher than Example 1, it was still lower than Comparative Example 1, and the effect of decreasing Vf in accordance with the present invention could be attained.

Example 9

In the present example, a nitride semiconductor light emitting device having the structure shown in FIG. 1 was formed. Specifically, an LED as the nitride semiconductor light emitting device of the present invention was formed through the same method as Example 1 except that the growth temperature of n-side GaN layer 101 was set to 500° C.

The resulting LED exhibited emission wavelength of 460 nm, emission output of 3.7 mW and forward voltage Vf of 4.5V, when operated with forward current of 20 mA. Though Vf was slightly higher than Example 1, it was still lower than Comparative Example 1, and though the light emission output is slightly lower than Comparative Example 1, the decrease is not significant.

From these results, it was confirmed that by forming the n-side GaN layer at the growth temperature in the range of 500 to 1000° C., the effect of decreasing Vf could be attained. Further, it was confirmed that particularly good Vf decreasing effect could be attained when nitrogen was used as the carrier gas. Further, the effect of improving light emission output could also be attained when the n-side GaN layer was formed to have a stacked structure of layers having different n-type impurity concentrations.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a nitride semiconductor light emitting device including at least an n-type nitride semiconductor, a p-type nitride semiconductor and an active layer formed between said n-type nitride semiconductor and said p-type nitride semiconductor; wherein said n-type nitride semiconductor includes at least an n-type contact layer and an n-side GaN layer; and said n-side GaN layer consists of a single or a plurality of undoped and/or n-type layers; said method comprising:

forming said n-type contact layer by organic metal vapor deposition with a growth temperature set within a range of 1000 to 1100° C., and forming said n-side GaN layer by organic metal vapor deposition with a growth temperature set within a range of 500 to 900° C. and using nitrogen as a carrier gas, such that said n-side GaN layer is formed directly on said n-type contact layer, and between said n-type contact layer and said active layer.

2. The method of manufacturing a nitride semiconductor light emitting device according to claim 1, wherein said n-side GaN layer is formed of said n-type layer containing an n-type impurity at a concentration of at least $1\times10^{18}/cm^3$.

3. The method of manufacturing a nitride semiconductor light emitting device according to claim 1, wherein said n-side GaN layer and said active layer are formed to be in contact with each other, and said n-type contact layer contains an n-type impurity at a concentration of at least $1\times10^{18}/cm^3$.

4. The method of manufacturing a nitride semiconductor light emitting device according to claim 3, wherein said n-side GaN layer is formed of said n-type layer containing an n-type impurity at a concentration of at least $1\times10^{18}/cm^3$.

5. The method of manufacturing a nitride semiconductor light emitting device according to claim 1, wherein each of said n-type contact layer and said n-side GaN layer is formed only of an undoped or n-type GaN layer.

6. The method of manufacturing a nitride semiconductor light emitting device according to claim 1, wherein said n-side GaN layer is formed of an n-type layer containing an n-type impurity at a concentration of at least $1\times10^{18}/cm^3$.

7. The method of manufacturing a nitride semiconductor light emitting device according to claim 6, wherein said n-side GaN layer and said active layer are formed to be in contact with each other and said n-type contact layer contains an n-type impurity at a concentration of at least $1\times10^{18}/cm^3$.

8. The method of manufacturing a nitride semiconductor light emitting device according to claim 7, wherein said n-side GaN layer is formed of said n-type layer containing an n-type impurity at a concentration of at least $1\times10^{18}/cm^3$.

9. The method of manufacturing a nitride semiconductor light emitting device according to claim 1, wherein growth rate of said n-side GaN layer is at most 2 μm/h.

10. The method of manufacturing a nitride semiconductor light emitting device according to claim 9, wherein said n-side GaN layer is formed of said n-type layer containing an n-type impurity at a concentration of at least $1\times10^{18}/cm^3$.

11. The method of manufacturing a nitride semiconductor light emitting device according to claim 9, wherein said n-side GaN layer and said active layer are formed to be in contact with each other, and said n-type contact layer contains an n-type impurity at a concentration of at least $1\times10^{18}/cm^3$.

12. The method of manufacturing a nitride semiconductor light emitting device according to claim 11, wherein said n-side GaN layer is formed of said n-type layer containing an n-type impurity at a concentration of at least $1\times10^{18}/cm^3$.

13. The method of manufacturing a nitride semiconductor light emitting device according to claim 9, wherein said n-type nitride semiconductor is formed of an undoped or n-type GaN layer.

14. The method of manufacturing a nitride semiconductor light emitting device according to claim 13, wherein said n-side GaN layer is formed of said n-type layer containing an n-type impurity at a concentration of at least $1\times10^{18}/cm^3$.

15. The method of manufacturing a nitride semiconductor light emitting device according to claim 13, wherein said n-side GaN layer and said active layer are formed to be in contact with each other, and said n-type contact layer contains an n-type impurity at a concentration of at least $1\times10^{18}/cm^3$.

16. The method of manufacturing a nitride semiconductor light emitting device according to claim 15, wherein said n-side GaN layer is formed of said n-type layer containing an n-type impurity at a concentration of at least $1\times10^{18}/cm^3$.

* * * * *